US010139714B2

United States Patent
Takamatsu

(10) Patent No.: US 10,139,714 B2
(45) Date of Patent: Nov. 27, 2018

(54) LIGHT SOURCE APPARATUS INCLUDING FORCE REDUCING SUPPORTING SECTION

(71) Applicant: SONY CORPORATION, Tokyo (JP)

(72) Inventor: Takashi Takamatsu, Tokyo (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/314,029

(22) PCT Filed: Apr. 13, 2015

(86) PCT No.: PCT/JP2015/002046
§ 371 (c)(1),
(2) Date: Nov. 25, 2016

(87) PCT Pub. No.: WO2015/186290
PCT Pub. Date: Dec. 10, 2015

(65) Prior Publication Data
US 2017/0199448 A1    Jul. 13, 2017

(30) Foreign Application Priority Data

Jun. 3, 2014 (JP) ................................ 2014-114620

(51) Int. Cl.
*G03B 21/16* (2006.01)
*F21S 2/00* (2016.01)
(Continued)

(52) U.S. Cl.
CPC ............... *G03B 21/16* (2013.01); *F21S 2/00* (2013.01); *F21V 29/503* (2015.01); *F21V 29/51* (2015.01);
(Continued)

(58) Field of Classification Search
CPC .......... F21S 2/00; F21V 29/503; F21V 29/51; F21V 29/76; F28D 15/0275; G03B 21/00;
(Continued)

(56) References Cited

U.S. PATENT DOCUMENTS

2006/0262821 A1*  11/2006  Wittenberg ........ G03B 21/2033
                                                372/36

FOREIGN PATENT DOCUMENTS

JP         2005-024964 A      1/2005
JP         2010-225874 A     10/2010
(Continued)

OTHER PUBLICATIONS

International Search Report dated Jun. 9, 2015, in PCT/JP2015/002046, filed Apr. 13, 2015.
(Continued)

*Primary Examiner* — Sultan Chowdhury
*Assistant Examiner* — Magda Cruz
(74) *Attorney, Agent, or Firm* — Oblon, McClelland, Maier & Neustadt, L.L.P.

(57) ABSTRACT

A light source apparatus according to an embodiment of the present technology includes a light source section, a member, and a support section. The light source section including a contacted surface formed in a predetermined position. The member is attached to the light source section and in contact with the contacted surface. The support section is capable of supporting a component of a load that acts on the contacted surface due to the weight of the member, the component being in at least a predetermined direction and supported by the support section in both orientations of the predetermined direction.

14 Claims, 16 Drawing Sheets

(51) Int. Cl.
      *H04N 5/74*       (2006.01)
      *H05K 7/20*       (2006.01)
      *F21V 29/503*     (2015.01)
      *F21V 29/76*      (2015.01)
      *F21V 29/51*      (2015.01)
      *G03B 21/20*      (2006.01)
      *F28D 15/02*      (2006.01)

(52) U.S. Cl.
      CPC .......... *F21V 29/76* (2015.01); *F28D 15/0275* (2013.01); *G03B 21/20* (2013.01); *G03B 21/2093* (2013.01); *H04N 5/74* (2013.01); *H05K 7/20* (2013.01)

(58) Field of Classification Search
      CPC ...... G03B 21/16; G03B 21/2093; H04N 5/74; H05K 7/20
      See application file for complete search history.

(56) References Cited

FOREIGN PATENT DOCUMENTS

| | | | |
|---|---|---|---|
| JP | 2012-186358 A | 9/2012 | |
| JP | 2014-59515 A | 4/2014 | |
| JP | WO 2014073152 A1 * | 5/2014 | ............ H04N 9/315 |
| WO | 2014/073152 A1 | 5/2014 | |

OTHER PUBLICATIONS

Extended European Search Report dated Dec. 20, 2017 in corresponding European Patent Application No. 15803881.0, 7 pages.

* cited by examiner

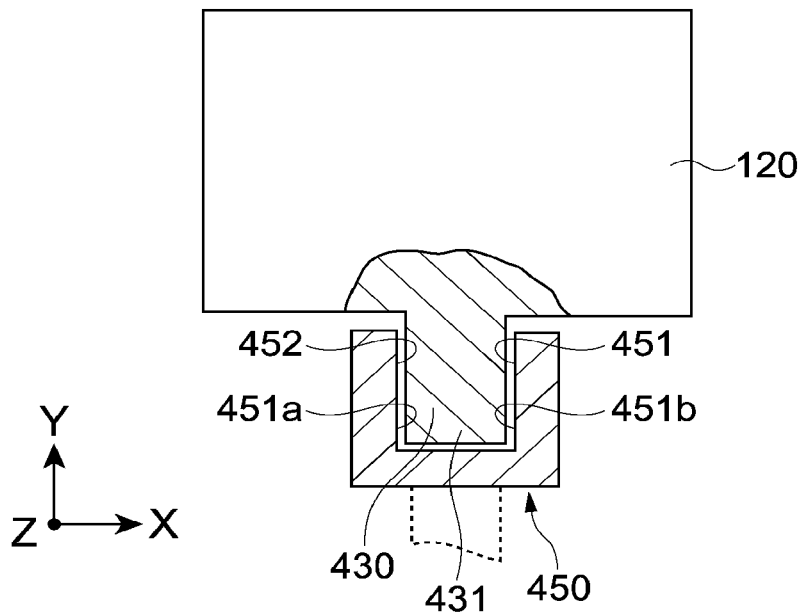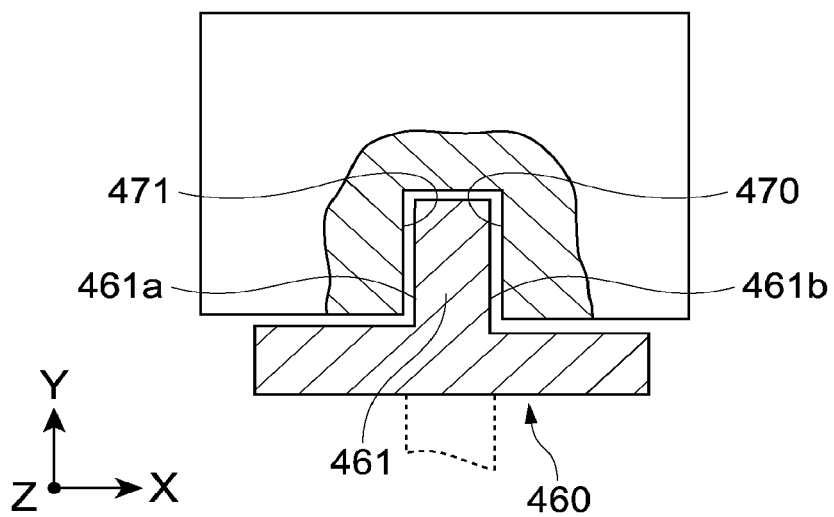
FIG.10

LIGHT SOURCE APPARATUS INCLUDING FORCE REDUCING SUPPORTING SECTION

TECHNICAL FIELD

The present technology relates to a light source apparatus and an image display apparatus using the same.

BACKGROUND ART

Conventionally, image display apparatuses such as projectors have been widely used. For example, light from light sources is modulated by a light modulator such as a liquid-crystal device and the modulated light is projected to a screen or the like, such that an image is displayed. Mercury-vapor lamps, xenon lamps, LEDs (Light Emitting Diodes), LDs (Laser Diodes), and the like are used as the light sources. Among them, solid-state light sources such as the LEDs and LDs have long lifetimes and do not require frequent lamp replacement unlike the conventional case. Further, it is advantageous in that they light up immediately after powered on.

For example, Patent Document 1 has described a light source apparatus using a plurality of laser light sources and an image display apparatus using the same. In the light source apparatus described in Patent Document 1, as shown in FIG. 21, a plurality of laser light sources 31 are provided on a rear side of a phosphor unit 20 capable of emitting white light W including blue laser light B1 and visible light from a phosphor. Then, the blue laser light B1 is emitted from the plurality of laser light sources 31 in the same direction as an optical axis direction of the phosphor unit 20. Such a configuration enables a space 90 on a rear side of two light source sections 32 to be easily ensured as a space for cooling. When a cooling member 95 such as a heat sink and a cooling fan are provided in this space 90, the plurality of laser light sources 31 can be efficiently cooled from a back side 7 (paragraphs [0110] to [0112], etc. of Patent Document 1).

Patent Document 1: PCT International Publication No. WO2014/073152

SUMMARY

Problem to be Solved

In recent years, the luminance of the projector has been increased. Therefore, there is a demand for a technology useful for cooling a light source section in which laser light sources and the like are provided as described in Patent Document 1. For example, it is desirable to suitably cool the light source section without affecting light emission of the light source section.

In view of the above-mentioned circumstances, it is an object of the present technology to provide a light source apparatus and an image display apparatus, by which a light source section can be suitably cooled.

Means for Solving the Problem

In order to achieve the above-mentioned object, a light source apparatus according to an embodiment of the present technology includes a light source section, a member, and a support section.

The light source section includes a contacted surface formed in a predetermined position.

The member is attached to the light source section and in contact with the contacted surface.

The support section is capable of supporting a component of a load that acts on the contacted surface due to the weight of the member, the component being in at least a predetermined direction and supported by the support section in both orientations of the predetermined direction.

In this light source apparatus, the component of the load that acts on the contacted surface due to the weight of the member, which is in the at least one direction, is supported in the both orientations of that direction. Therefore, influences on the light source section via the contacted surface due to the weight of the member can be reduced. When a cooling member such as a heat sink is attached to the light source section, the light source section can be suitably cooled with the present technology.

The light source section may include one or more light sources. In this case, the member may be a cooling member that cools the one or more light sources via the contacted surface.

For example, even if a heavy, large cooling member is used, the load on the contacted surface can be reduced by the support section, and hence the one or more light sources can be suitably cooled.

The support section may be capable of supporting components of the load, the components being in a first direction that is a direction of a normal of the contacted surface, a second direction orthogonal to the first direction, and a third direction orthogonal to both of the first and second directions.

With this, even if the direction in which the light source apparatus is used is arbitrarily changed, influences on the light source section due to the weight of the member can be reduced.

The support section may include a first contact surface capable of being brought into contact with the member while the first contact surface being oriented in a first orientation of the predetermined first direction, and a second contact surface capable of being brought into contact with the member while the second contact surface being oriented in a second orientation opposite to the first orientation of the predetermined direction.

In this manner, the first and second contact surfaces are brought into contact with the member, and hence the load can be sufficiently supported.

The first and second contact surfaces may be arranged in positions such that a clearance is formed with respect to the member, in a reference attachment position in which the member is attached to the light source section.

With this, it is possible to prevent excessive force from being applied from the first and second contact surfaces to the member.

The support section may include a first contact portion including the first contact surface, and a second contact portion that includes the second contact surface and is positioned opposed to the first contact portion while sandwiching the member therebetween.

In this manner, the load may be supported by the first and second contact portions opposed to each other.

The member may include a convex portion. In this case, the support section may include a support hole portion that includes an inner peripheral surface that is the first and second contact surfaces, the convex portion being inserted into the support hole portion.

In this manner, the load may be supported by the convex portion of the member being inserted into the support hole portion of the support section.

The member may include a hole portion. In this case, the support section may include a support convex portion that includes the first and second contact surfaces and is inserted into the hole portion.

In this manner, the load may be supported by the support convex portion of the support section being inserted into the hole portion of the member.

An image display apparatus according to an embodiment of the present technology includes the above-mentioned light source apparatus, an image generation system, and a projection system.

The image generation system includes an image generation element that generates an image on the basis of irradiated light, and an illumination optical system that irradiates the image generation element with light from the light source apparatus.

The projection system projects the image generated by the image generation element.

Effects

As described above, in accordance with the present technology, it becomes possible to suitably cool a light source section. It should be noted that the effects described here are not necessarily limitative and may be any effect described in the present disclosure.

BRIEF DESCRIPTION OF DRAWINGS

FIG. 10 A schematic diagram showing another configuration example of the support sections according to the present technology.

DESCRIPTION OF PREFERRED EMBODIMENTS

Hereinafter, embodiments according to the present technology will be described with reference to the drawings.

[Image Display Apparatus]

Figure 1:
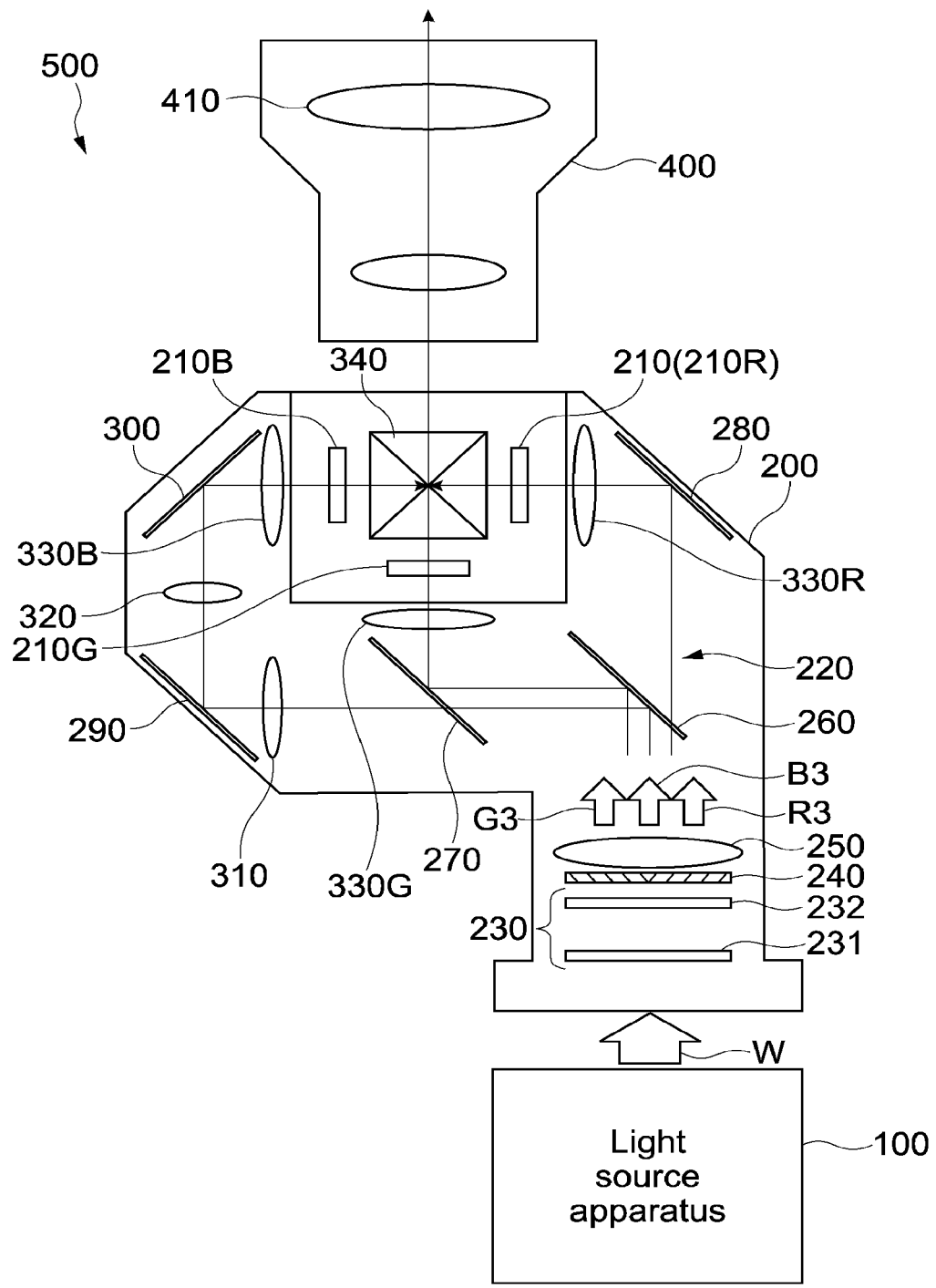
FIG. 1 A schematic diagram showing a configuration example of an image display apparatus according to an embodiment.

FIG. 1 is a schematic diagram showing a configuration example of an image display apparatus according to an embodiment of the present technology. An image display apparatus 500 is used as a projector for presentation or digital cinema, for example. The present technology described below is also applicable to image display apparatuses used for the other purposes.

The image display apparatus 500 includes a light source apparatus 100, an image generator system 200, and a projection system 400. The light source apparatus 100 is capable of emitting light. The image generator system 200 generates an image, using light from the light source apparatus 100. The projection system 400 projects the image generated by the image generation system 200 to a screen (not shown) or the like.

The light source apparatus 100 emits white light W including red light, green light, and blue light. The light source apparatus 100 will be described later in detail.

The image generation system 200 includes an image generation element 210 that generates an image on the basis of the emitted light and an illumination optical system 220 that radiates the light emitted from the light source apparatus 100 to the image generation element 210. Further, the image generation system 200 includes an integrator element 230, a polarization conversion element 240, and a light collection lens 250.

The integrator element 230 includes a first fly eye lens 231 including a plurality of micro lenses two-dimensionally arranged and a second fly eye lens 232 including a plurality of micro lenses arranged corresponding to the micro lenses one by one.

The white light W entering the integrator element 230 from the light source apparatus 100 is divided by the micro lenses of the first fly eye lens 231 into a plurality of light fluxes and forms an image on each of the corresponding micro lenses in the second fly eye lens 232. Each of the micro lenses of the second fly eye lens 232 functions as a secondary light source. A plurality of parallel light beams having the same luminance are emitted to the polarization conversion element 240 as incident light.

The integrator element 230 functions, as a whole, to adjust the incident light, which is emitted from the light source apparatus 100 to the polarization conversion element 240, to have uniform luminance distribution.

The polarization conversion element 240 functions to equalize polarization states of the incident light entering via the integrator element 230 and the like. This polarization conversion element 240 emits white light including blue light B3, green light G3, and red light R3 via, for example, the light collection lens 250 or the like disposed on an emitting side of the light source apparatus 100.

The illumination optical system 220 includes dichroic mirrors 260 and 270, mirrors 280, 290, and 300, relay lenses 310 and 320, field lenses 330R, 330G, and 330B, liquid-crystal light bulbs 210R, 210G, and 210B as the image generation elements, and a dichroic prism 340.

The dichroic mirrors 260 and 270 have characteristics to selectively reflect color light having a predetermined wavelength region and allow light having other wavelength regions to pass therethrough. Referring to FIG. 1, for example, the dichroic mirror 260 selectively reflects the green light G3 and the blue light B3. The dichroic mirror 270 selectively reflects the green light G3 out of the green light G3 and the blue light B3 that are reflected by the dichroic mirror 260. The remaining blue light B3 passes through the dichroic mirror 270. With this, the light emitted from the light source apparatus 100 is separated into the plurality of different color light beams. Note that a configuration for separating the plurality of color light beams, a device to be used, and the like are not limited.

The separated red light R3 is reflected by a mirror 280, and then passes through a field lens 330R to thereby be parallelized. After that, such red light R3 enters a liquid-crystal light bulb 210R for modulation of the red light. The green light G3 passes through a field lens 330G to thereby be parallelized. After that, such green light G3 enters a liquid-crystal light bulb 210G for modulation of the green light. The blue light B3 is reflected by a mirror 290 through a relay lens 310 and further reflected by a mirror 300 through a relay lens 320. The blue light B3 reflected by the mirror 300 passes through a field lens 330B to thereby be parallelized. After that, such blue light B3 enters a liquid-crystal light bulb 210B for modulation of the blue light.

The liquid-crystal light bulbs 210R, 210G, and 210B are electrically connected to a signal source (not shown) (e.g., PC) that supplies an image signal including image information. The liquid-crystal light bulbs 210R, 210G, and 210B modulate, on the basis of the supplied color image signals, the incident light to generate a red image, a green image, and a blue image, respectively. The modulated color light beams (formed images) enter the dichroic prism 340 and are combined. The dichroic prism 340 superimposes and combines the color light beams entering in the three directions and emits them toward the projection system 400.

The projection system 400 projects the image generated by the image generation element 210. The projection system 400 includes a plurality of lenses 410 and the like and irradiates a screen (not shown) or the like with the light combined by the dichroic prism 340. Thus, a full-color image is displayed.

[Light Source Apparatus]

Figure 2:
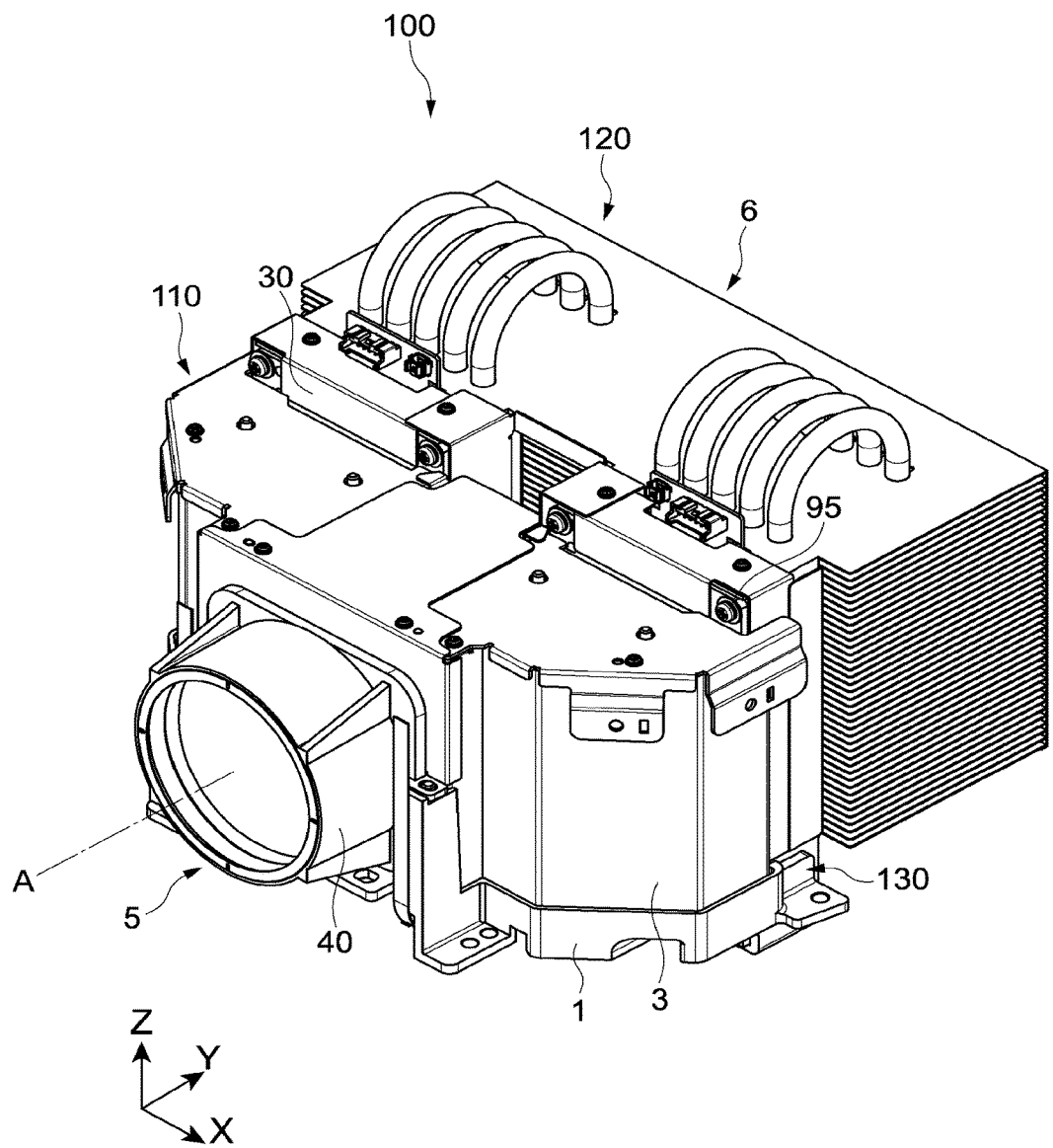
FIG. 2 A perspective view showing a configuration example of a light source apparatus.

FIG. 2 is a perspective view showing a configuration example of the light source apparatus 100. The light source apparatus 100 includes a light source section 110 that emits white light, a heat sink (cooling member) 120 that is attached to the light source section 110, and a support section 130 that supports the heat sink 120. Assuming that a side on which the white light is emitted is a front side 5 and an opposite side thereof is a back side 6, the heat sink 120 is attached to the back side 6 of the light source section 110.

The light source section 110 includes a base portion 1 provided in the bottom portion and a housing portion 3 supported by the base portion 1. The base portion 1 has a shape long in one direction. A longitudinal direction of the elongated base portion 1 is left- and right-hand directions (x-axis direction) of the light source apparatus 100 and a lateral direction orthogonal to the longitudinal direction is front and rear directions (y-axis direction). Further, a direction orthogonal to both of the longitudinal direction and the lateral direction is a height direction (z-axis direction) of the light source apparatus 100.

A light source unit 30 and a phosphor unit 40 are mounted on the base portion 1. The light source unit 30 includes one or more solid-state light sources. The phosphor unit 40 receives light of the light source unit 30 and generates and emits white light. Inside the housing portion 3, laser light emitted from the one or more solid-state light sources is guided to the phosphor unit 40. Then, white light is generated by the phosphor unit 40 and the white light is emitted along an optical axis A.

Figure 3:
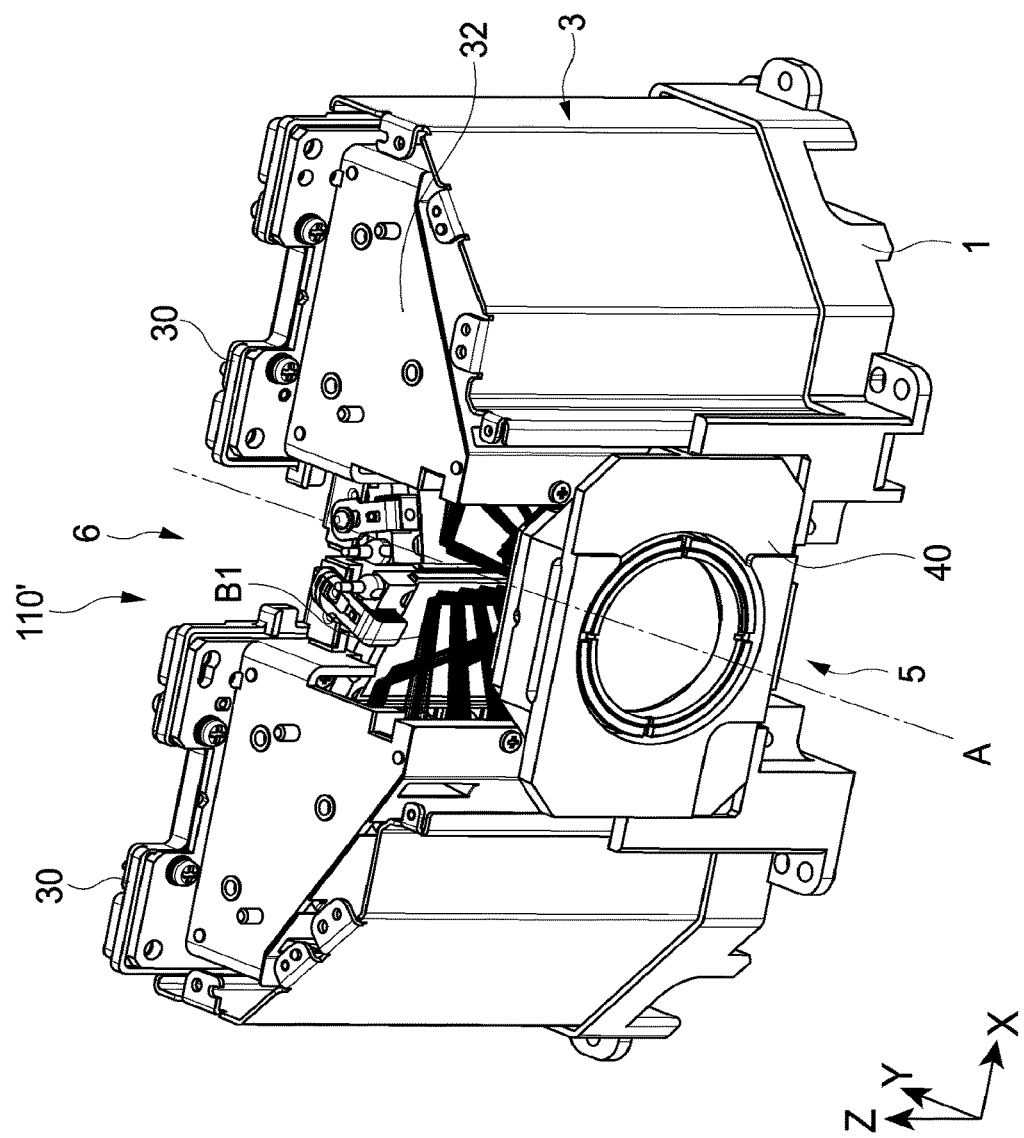
FIG. 3 A diagram of a state in which an upper surface portion of a light source section is detached.
Figure 4:
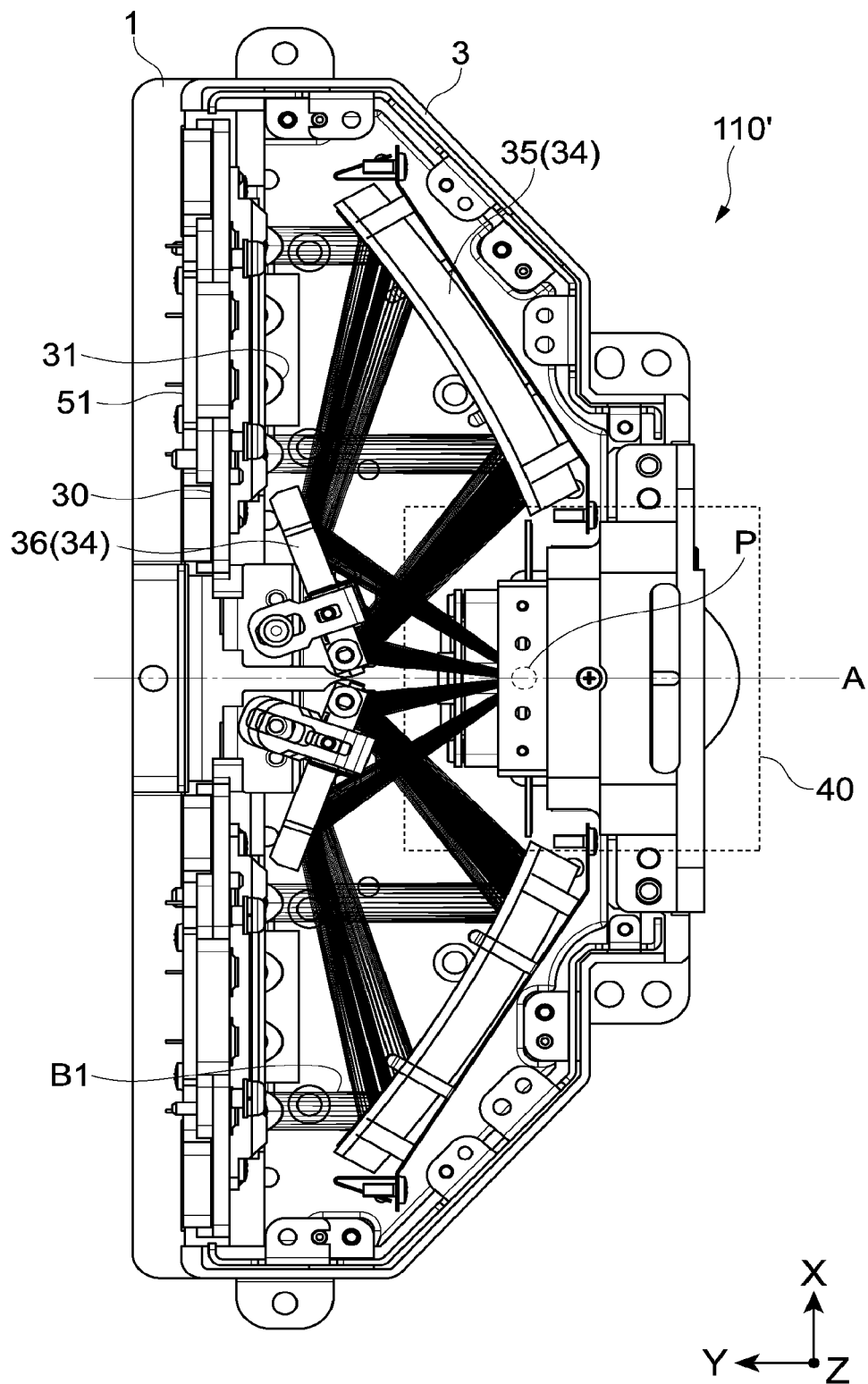
FIG. 4 A plan view of the light source section shown in FIG. 3 as viewed from the top.
Figure 5:
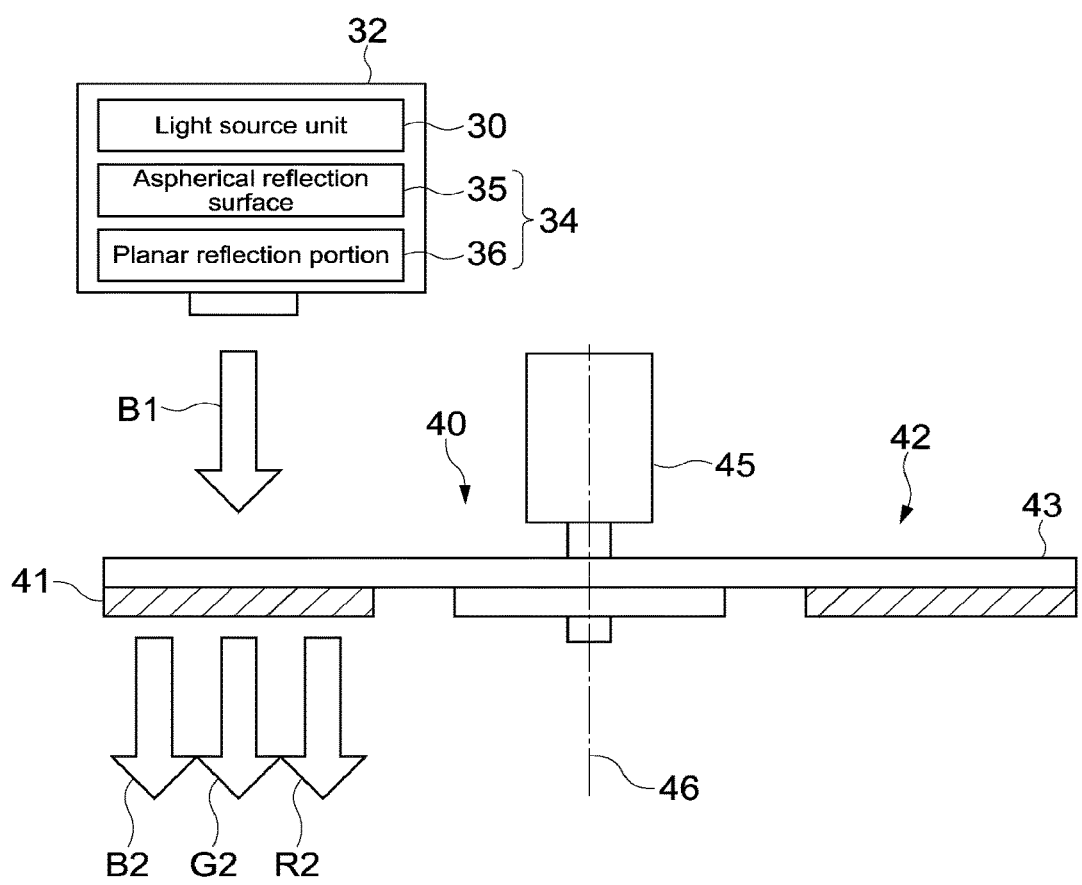
FIG. 5 A view for describing generation of white light by the light source section.

Referring to FIGS. 3 to 5, an internal configuration example of the light source section 110 and a generation example of the white light will be described. In FIGS. 3 and 4, a light source section 110' in a form different from that of the light source section 110 shown in FIG. 2 is shown. However, the configuration example and generation example to be described below are applicable to the light source section 110 shown in FIG. 1 as they are. Note that, in comparison with the light source section 110 shown in FIG. 2, an outer appearance of the phosphor unit 40 has a shape different from that of a portion supporting a mounting substrate on which the plurality of laser light sources are mounted.

FIG. 3 is a diagram of a state in which the upper surface portion of the light source section 110' is detached. FIG. 4 is a plan view of the light source section 110' shown in FIG. 3 as viewed from the top. As shown in FIGS. 3 and 4, on the back side 6 of the base portion 1, two light source units 30 are arranged in the longitudinal direction. Each of the light source units 30 includes a plurality of laser light sources (laser diodes) 31 mounted on a mounting substrate 51. The plurality of laser light sources 31 are arranged to be capable of emitting light toward the front side 5 with the front and rear directions being an optical axis direction.

In this embodiment, the plurality of laser light sources 31 are a blue-laser light sources capable of oscillating blue laser light B1 having a peak wavelength of emission intensity within a wavelength range of 400 nm to 500 nm, for example. The laser light sources may be replaced by other solid-state light sources such as LEDs. Further, also when the solid-state light sources may be replaced by mercury-vapor lamps, xenon lamps, or the like, the present technology is applicable.

In front of the two light source units 30, light collection optical systems 34 are arranged. The light collection optical system 34 collects the blue laser light B1 from the plurality of laser light sources 31 onto a predetermined point P of the phosphor unit 40. Note that FIG. 3 shows a frame 32 that supports the light source units 30 and the light collection optical system 34 as a single unit. In FIG. 4, the illustration of the frame 32 is omitted such that the light collection optical system 34 can be seen.

As shown in FIG. 4, the light collection optical system 34 includes an aspherical reflection surface 35 and a planar reflection portion 36. The aspherical reflection surface 35 reflects and collects light emitted from the plurality of laser light sources 31. The planar reflection portion 36 collects the light reflected by the aspherical reflection surface 35 to the predetermined point P of the phosphor unit 40. The predetermined point P is a point set on a phosphor layer of the phosphor unit 40.

As shown in FIG. 4, a direction of the optical axis A of the white light and an optical axis direction of the blue laser light B1 emitted from the plurality of laser light sources 31 are set to be the same direction. This enables a space for the heat sink 120 to be easily ensured on the back side 6 of the light source section 110'. Then, the plurality of laser light sources 31 can be efficiently cooled from the back side 6.

FIG. 5 is a diagram for describing generation of the white light by the light source section 110' and also is a diagram schematically showing a phosphor wheel provided inside the phosphor unit 40.

A phosphor wheel 42 includes a disk-shaped substrate 43 that transmits the blue laser light B1 therethrough and a phosphor layer 41 disposed on the substrate 43. At the center of the substrate 43, a motor 45 that drives the phosphor wheel 42 is connected and the phosphor wheel 42 is provided to be rotatable about a rotation axis 46. The rotation axis 46 is located such that the predetermined point P of the phosphor layer 41 is positioned at approximately the center (on the optical axis A) of the phosphor unit 40.

The phosphor layer 41 contains a fluorescent substance that is excited by the blue laser light B1 and emits fluorescence. Then, the phosphor layer 41 converts a part of the blue laser light B1 emitted by the plurality of laser light sources 31 into light (i.e., yellow light) in a wavelength region of a red wavelength region to a green wavelength region. As the fluorescent substance of the phosphor layer 41, for example, a YAG (Yttrium Aluminum Garnet)-based phosphor is used.

Further, the phosphor layer 41 transmits a part of the excited light therethrough, such that the blue laser light B1 emitted from the plurality of laser light sources 31 can also be emitted. With this, light emitted from the phosphor layer 41 becomes white light due to the mixture of blue excited light and yellow fluorescence. The part of the excited light is transmitted, and hence, for example, filler particles that are light-transmissive particulate substances may be used.

While the substrate 43 is rotated by the motor 45, the blue laser light B1 is emitted from the laser light sources 31. The blue laser light B1 is radiated to the phosphor layer 41 in such a manner that it relatively draws a circle correspondingly to the rotation of the substrate 43. With this, the white light including blue laser light B2 that has been transmitted through the phosphor layer 41 and green light G2 and red light R2 that are the visible light from the phosphor layer 41 is emitted from the phosphor unit 40.

A configuration of the light source section 110 is not limited and may be appropriately designed. A configuration of the phosphor unit can also be appropriately designed. Without the phosphor unit, laser light sources or the like capable of emitting color laser light beams of RGB may be used and the color laser light beams of RGB may be combined to generate the white light.

Figure 6:
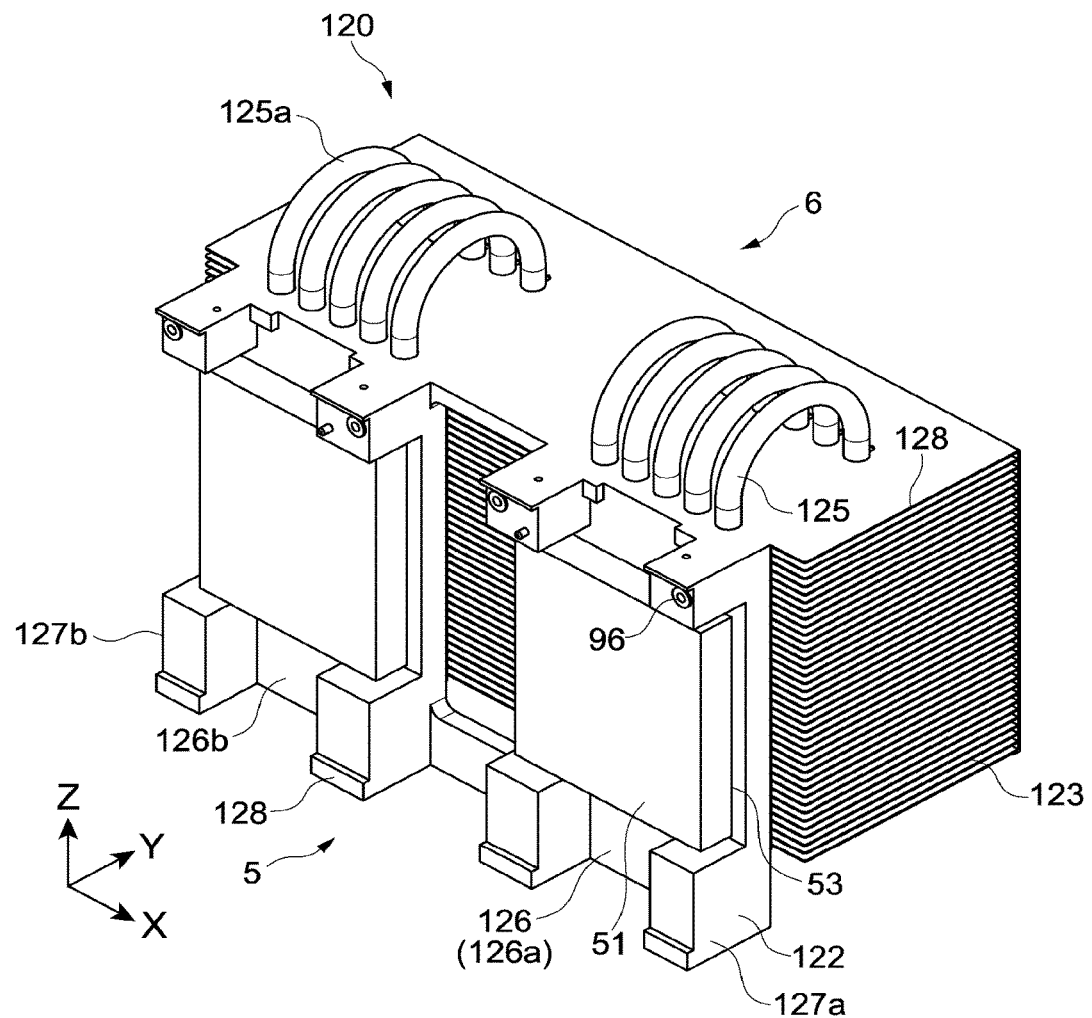
FIG. 6 A perspective view showing a configuration example of a heat sink.

FIG. 6 is a perspective view showing a configuration example of the heat sink 120 according to this embodiment. In FIG. 6, the mounting substrates 51 that are cooling targets are schematically shown.

The heat sink 120 includes a plurality of fins 123, bases 122, and a plurality of heat pipes 125. The plurality of fins 123 are each formed in a plate shape and connected to the bases 122 by soldering, for example. The fins 123 are superimposed at predetermined intervals in the height direction. Those intervals serve as channels for the cooling air, for example. The fins 123 are formed of material having a high thermal conductivity, such as copper. The number of fins 123, the size and the material of the fins 123, and the like are not limited.

The bases 122 are portions attached to the light source section 100. The bases 122 are thermally connected to the mounting substrates 51 on which the plurality of laser light sources 31 are mounted. Typically, the bases 122 are attached on the side of back surfaces 53 of the mounting substrates 51 in contact therewith. The bases 122 and the mounting substrates 51 are thermally connected to each other via other members. The bases 122 are formed of material having a high thermal conductivity, such as copper, and the plurality of laser light sources 31 can be sufficiently cooled.

With the bases 122 being held in contact with the mounting substrates 51, screws 95 shown in FIG. 2 are inserted into screw holes 96 formed in upper portions of the bases 122. With this, the contact of the bases 122 with the mounting substrates 51 is maintained. Note that, in this embodiment, the back surfaces 53 of the mounting substrates 51 (or surfaces of other members) held in contact with the bases 122 correspond to contacted surfaces formed in predetermined positions.

The plurality of heat pipes 125 each have a shape with an approximately center portion 125a thereof being folded. The plurality of heat pipes 125 are connected to the bases 122, at portions thereof from the center portions 125a to one end portions. Then, portions thereof from the center portions 125a to the other end portions are provided on the back side 6 of the fins 123 such that they penetrate the plurality of fins 123. The plurality of heat pipes 123 are connected to the bases 122 and the plurality of fins 123 by soldering, for example.

The heat pipes 125 conducts heat generated from the light source unit 30 to a rear side of the fins 123. As a result, the cooling capability of the heat sink 120 can be enhanced. Note that the number of heat pipes and the like are not limited.

The support section 130 shown in FIG. 2 is capable of reducing influences on the light source section 110 due to the weight of the heat sink 120 if a direction in which the image display apparatus 500 is used is changed, for example. Before describing the support section 130 according to this embodiment, a general outline of the support section according to the present technology will be first described.

Figure 7:
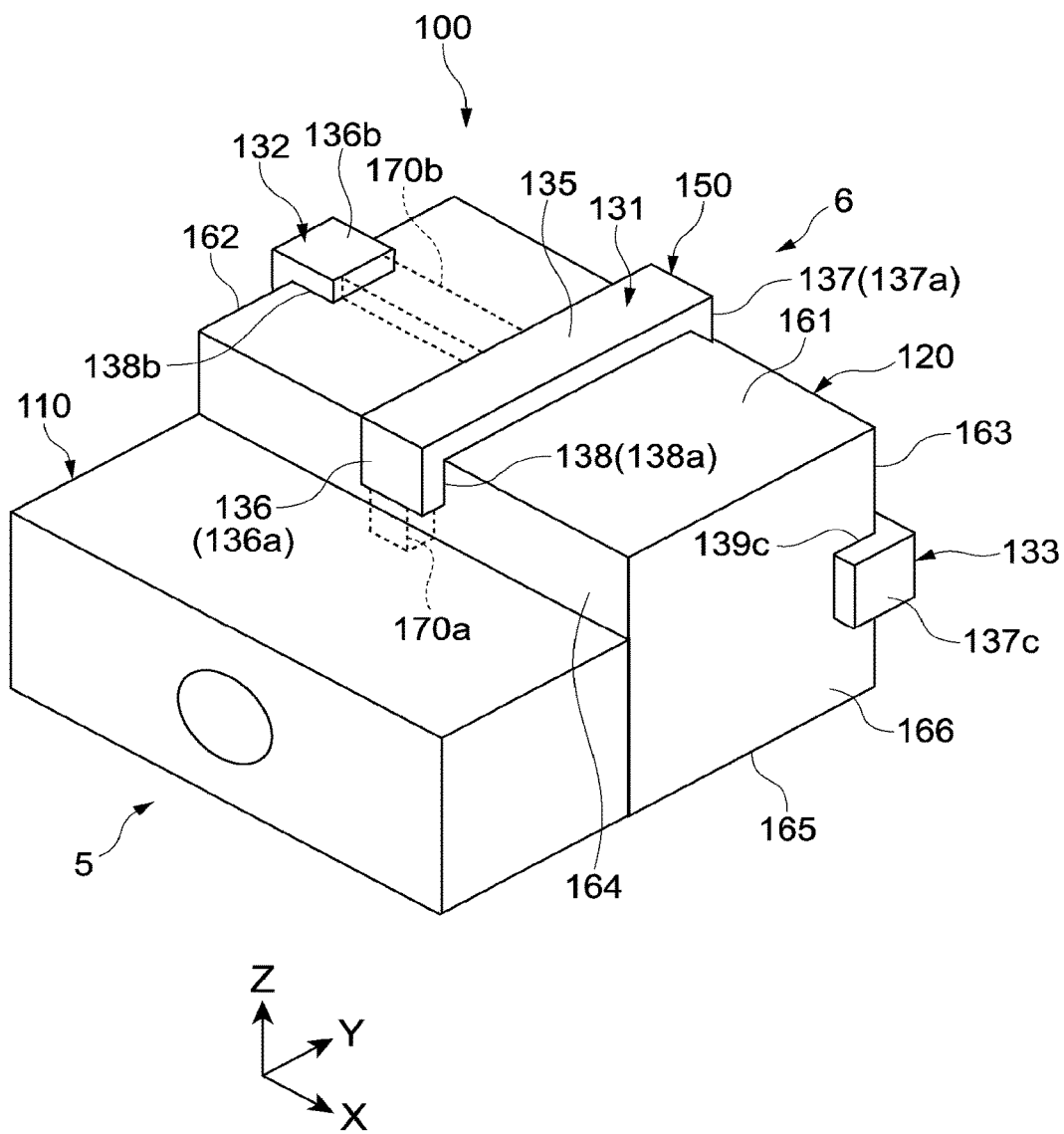
FIG. 7 A schematic perspective view of the light source apparatus as viewed from a front side.
Figure 8:
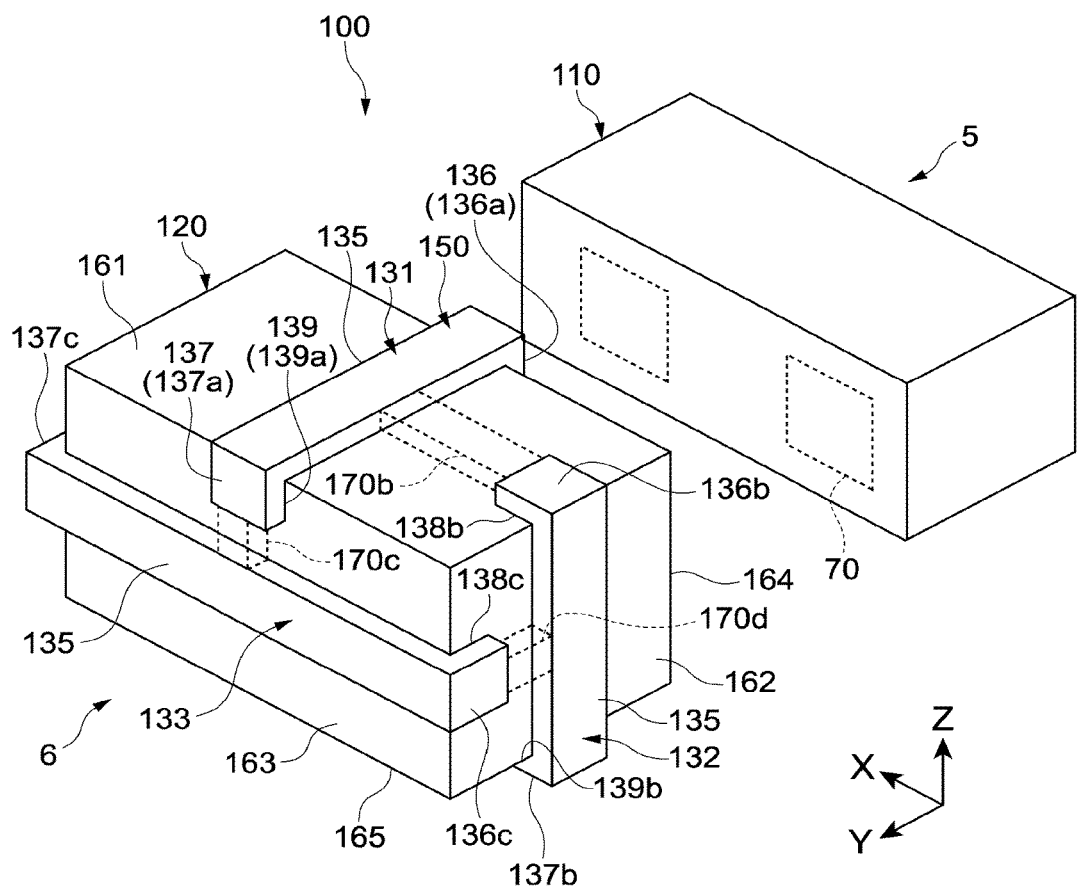
FIG. 8 A schematic perspective view of the light source apparatus as viewed from a rear side.

FIGS. 7 and 8 are perspective views each schematically showing the light source apparatus 100, where the light source section 110, the heat sink 120, and the support section are shown. Here, for easy understanding for the outline of the support section according to the present technology, a support section 150 (different symbol is used) having a different configuration from that of the support section 130 shown in FIG. 1 is shown. FIG. 7 is a view of the light source apparatus 100 as viewed from the front side 5. FIG. 8 is a view of the light source apparatus 100 as viewed from the back side 6. Further, in FIG. 8, a state in which the light source section 110 and the heat sink 120 are separated is shown.

Referring to FIG. 8, as also described above, two contacted surfaces 70 are formed on the back side 6 of the light source section 100. The contacted surfaces 70 are portions corresponding to the back surfaces 53 of the two mounting substrates 51. The heat sink 120 is attached to the light source section 110 in contact with the contacted surfaces 70.

The support section 150 is capable of supporting components of a load that acts on the contacted surfaces 70 due to the weight of the heat sink 120, which are in at least a predetermined direction, in both orientations of that predetermined direction. For example, when the direction of the image display apparatus 500 is changed, the direction or orientation of load that acts on the contacted surfaces 70 due to the weight of the heat sink 120 also change. The support section 150 enables the components of that load in the at least one predetermined direction to be supported. Further, irrespective of which orientation of the predetermined direction the load acts in, the support section 150 is capable of supporting the load.

The support section 150 illustrated in FIGS. 7 and 8 includes a first support member 131, a second support member 132, and a third support member 133. The first support member 131 is disposed on an upper surface 161 of the heat sink 120. The second support member 132 is disposed on a side surface 162. The third support member 133 is disposed on a back surface 163.

Each of the support members 131 to 133 has a shape with a plate-like member extending in one direction being vertically folded in the same direction at both ends thereof in the extending direction. That is, each of the support members 131 to 133 includes a base portion 135 extending in one direction, and a first contact portion 136 and a second contact portion 137 coupled to the both ends in the extending direction of the base portion 135. The first and second contact portions 136 and 137 opposed to each other in the extending direction of the base portion 135 are portions vertically folded in the same direction.

As shown in FIGS. 7 and 8, the first support member 131 is disposed along the first direction (y-axis direction) that is a direction of a normal of each of the contacted surfaces 70. The first support member 131 is provided such that a front surface 164 and the back surface 163 of the heat sink 120 are sandwiched between first and second contact portions 136a and 137a. A surface of the first contact portion 136a, which is opposed to the front surface 164 of the heat sink 120, serves as a first contact surface 138a. Further, a surface of the second contact portion 137a, which is opposed to the back surface 163 of the heat sink 120, serves as a second contact surface 139a.

The second support member 132 is disposed along the second direction (z-axis direction) that is orthogonal to the y-axis direction. The second support member 132 is provided such that the upper surface 161 and a lower surface 165 of the heat sink 120 are sandwiched between the first and second contact portions 136b and 137b. A surface of the first contact portion 136b, which is opposed to the upper surface 161 of the heat sink 120, serves as a first contact surface 138b. Further, a surface of a second contact portion 137b, which is opposed to the lower surface 165 of the heat sink 120, serves as a second contact surface 139b.

The third support member 133 is disposed along the third direction (x-axis direction) that is orthogonal in both of the y-axis direction and the z-axis direction. The third support member 133 is disposed such that the side surface 162 and the other side surface 166 of the heat sink 120 are sandwiched between first and second contact portions 136c and 137c. A surface of the first contact portion 136c, which is opposed to the side surface 162 of the heat sink 120, serves as a first contact surface 138c. Further, a surface of a second contact portion 137c, which is opposed to the side surface 166 of the heat sink 120, serves as a second contact surface 139c.

The first to third support members 131 to 133 are disposed for supporting a load due to the weight of the heat sink 120, and hence connected and fixed to members different from the heat sink 120. For example, the first to third support members 131 to 133 are connected to the light source section 110. For example, the first support member 131 is connected to the light source section 110 through a connection member 170a indicated by the broken lines in FIGS. 7 and 8. Further, the second support member 132 is connected to the first support member 131 through a connection member 170b. Further, the third support member 133 is connected to the first and second support members 131 and 132 through connection members 170c and 170d, respectively.

When the first to third support members 131 to 133 are connected to the light source section 110, loads may act on connection portions thereof while loads on the contacted surfaces 70 can be reduced. By appropriately setting a configuration, a connection method, and the like for the connection portions, it is sufficiently possible to cope with the loads that act on the connection portions. A method and a configuration for connecting the first to third support members 131 to 133 to the light source section 110 are not limited.

Each of the first to third support members 131 to 133 may be connected to a predetermined portion of the image display apparatus 500 instead of the light source section 110. This makes it possible to reduce loads that act on not only the contacted surfaces 70 but also on the light source section 110. In addition, a method and a configuration for fixing the first to third support members 131 to 133 are not limited.

The first to third support members 131 to 133 can sufficiently support components of a load that acts on the contacted surfaces 70 due to the weight of the heat sink 120, the components being in the x-, y-, and z-axis directions.

For example, it is assumed that, for example, when the light source apparatus 100 is tilted toward the front side 5 or the back side 6, force pressing the contacted surfaces 70 or force pulling the contacted surfaces 70 to the back side 6 act. In this case, the first contact surface 138a of the first support member 131 is brought into contact with the front surface 164 of the heat sink 120. With this, it is possible to reduce the force pressing the contacted surfaces 70. Further, the second contact surface 139a is held in contact with the back surface 163 of the heat sink 120 and supports this, and hence the force pulling the contacted surfaces 70 to the back side 6 can be reduced.

Further, for example, it is assumed that the light source apparatus 100 is disposed with the bottom surface 165 facing downward or the upper surface 161 facing downward. In such a case, for example, it is assumed that force downwardly or upwardly pulling the contacted surfaces 70 acts. In this case, the first contact surface 138b of the second support member 132 is brought into contact with the upper surface 161 of the heat sink 120 or the second contact surface 139b of the second support member 132 is brought into contact with the bottom surface 165 of the heat sink 120, and hence such force can be reduced.

Further, for example, it is assumed that force pulling the contacted surfaces 70 toward the side surface 162 or toward the side surface 166 acts when the light source apparatus 100 is tilted about the y-axis direction, for example. In this case, the first contact surface 138c of the third support member 133 is brought into contact with the side surface 162 of the heat sink 120 or the second contact surface 139c of the third support member 133 is brought into contact with the side surface 166 of the heat sink 120, and hence such force can be reduced.

Due to the provision of the support section 150, even if a heavy, large heat sink 120 is used, for example, the support section 150 enables the load applied to the contacted surfaces 70 to be sufficiently reduced. As a result, the plurality of laser light sources 131 of the light source section 110 can be suitably cooled. Further, tilt-free image display apparatus 500 and light source apparatus 100 can be realized.

Note that it is not limited to the configuration in which the loads in the three directions orthogonal to one another can be supported. For example, if orientations in which the image display apparatus 500 can be tilted or angles at which the image display apparatus 500 can be mounted are limited, a component in only one direction or components in only two directions may be supportable. Any member can be used as the support section according to the present technology as long as it can support a load in at least a predetermined direction. For example, one of the first to third support members 131 to 133 shown in FIGS. 7 and 8 may be used as the support section according to the present technology.

Figure 9:
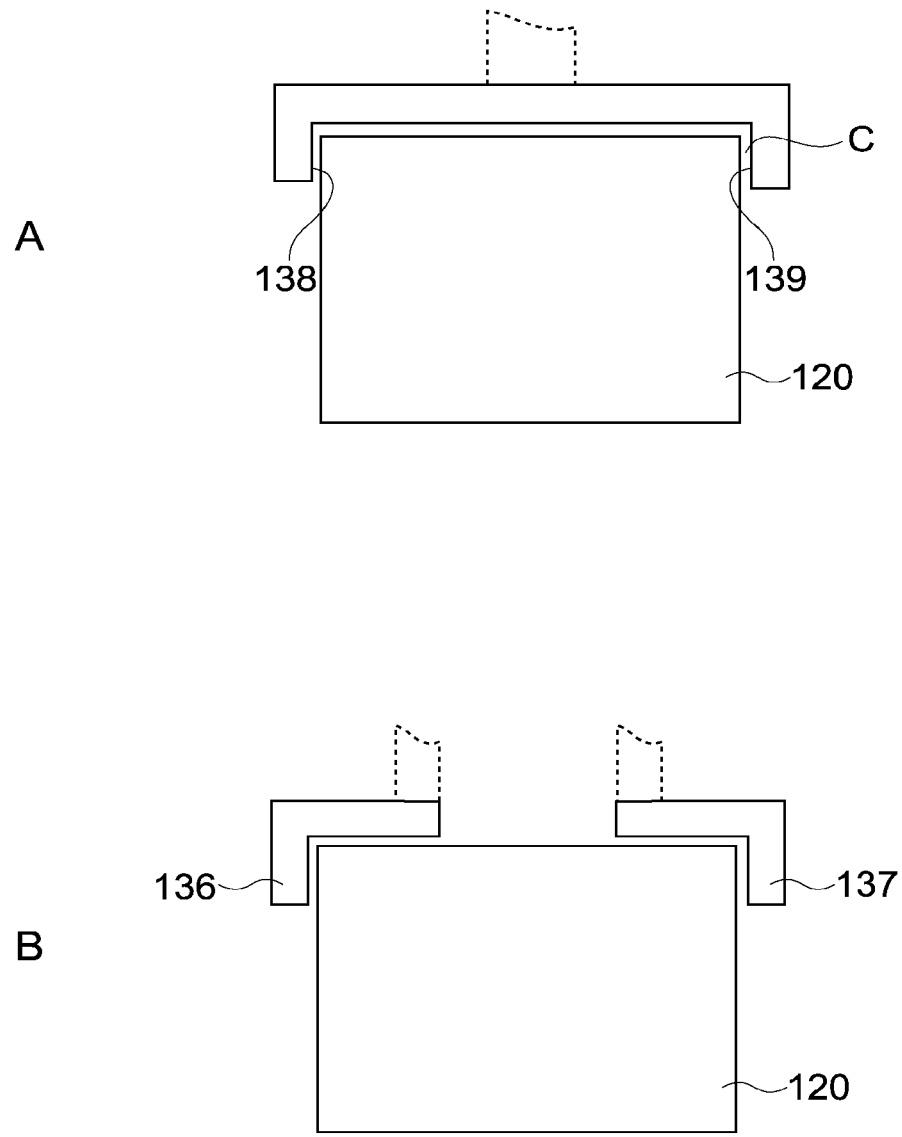
FIG. 9 A schematic diagram for describing arrangement of support sections with respect to the heat sink.

FIG. 9 is a schematic diagram for describing arrangement of the support sections with respect to the heat sink 120. As shown in A of FIG. 9, first and second contact surfaces 138 and 139 may be arranged in positions such that a clearance C is formed with respect to the heat sink 120, in a reference attachment position in which the heat sink 120 is attached to the light source section 110.

The reference attachment position in which the heat sink 120 is attached to the light source section 110 means a position in which the heat sink 120 is attached in suitable contact with the contacted surfaces 70 of the light source section 110, for example. For example, in the example shown in FIG. 2, it is an attachment position in a state in which the screws 95 are inserted into the screw holes 96 when the heat sink 120 is attached to the light source section 110. The reference attachment position can also be considered as a position in which a suitable contact state is achieved.

The first and second contact surfaces 138 and 139 are arranged such that the clearance C is formed, and hence it is possible to prevent excessive force from being applied from the first and second contact surfaces 138 and 139 to the heat sink 120. That is, it is possible to prevent unnecessary force from being applied to the heat sink 120 due to the contact such that a load due to the force acts on the contacted surfaces 70. Further, the first and second contact surfaces 138 and 139 are held in contact with the heat sink 120, and hence it is possible to avoid the possibility that the heat sink 120 may fail to be suitably attached in the reference attachment position. Further, the clearance C is formed, and hence it is also possible to eliminate a design error of the members, which would otherwise occur with many laser light sources.

When the clearance C is formed, the heat sink 120 moves by an amount corresponding to the clearance C due to its weight and the heat sink 120 is brought into contact with the first and second contact surfaces 138 and 139. In this manner, components of a load that acts on the contacted surfaces 70 are supported. The size of the clearance C may be appropriately set on the basis of the amount of movement of the heat sink 120, the magnitude of the load that should be supported, and the like. For example, the clearance C having a length of about 0.5 mm is formed. Note that the clearance C is unnecessary if accidental contact and the like can be avoided.

As shown in FIGS. 7 and 8, when the plurality of first contact surfaces 138 and the plurality of second contact surfaces 139 are arranged with respect to the heat sink 120, both of arrangement in which the space C is formed and arrangement in which the space C is not formed may be employed. Further, a configuration in which the first contact surfaces 138 are arranged with the clearance C and the second contact surfaces 139 are arranged without the clearance, for example, can also be employed.

Note that it is not limited to the case where the first and second contact portions 136 and 137 are integrally formed as a single member, and the first and second contact portions 136 and 137 may be formed of different members as shown in B of FIG. 9.

FIG. 10 is a schematic diagram showing another configuration example of the support section according to the present technology. A support section (that can also be used as a support member) 450 shown in A of FIG. 10 includes a support hole portion 452 including an inner peripheral surface 451. An opening shape of the support hole portion 452 is typically a rectangular shape. The inner peripheral surface 451 includes first and second surfaces 451a and 451b opposed to each other in the x-axis direction that is a predetermined direction and third and fourth surfaces (not shown) opposed to each other in the y-axis direction that is a direction orthogonal to the x-axis direction.

A convex portion 430 is formed in the heat sink 120. The convex portion 430 is inserted into the support hole portion 452. The shape of the convex portion 430 is typically a rectangular parallelepiped shape. Four side surfaces 431 are respectively opposed to first to fourth surfaces of the support hole portion 452.

In this example, the first and second surfaces 451a and 451b of the support hole portion 452 function as the first and second contact surfaces. Therefore, components of a load that acts on the contacted surfaces 70 due to the weight of the heat sink 120 are supported by the first and second surfaces 451a and 451b, the components being in the x-axis direction.

Further, the third and fourth surfaces of the support hole portion 452 also function as the first and second contact surfaces. Therefore, components of a load that acts on the contacted surfaces 70 due to the weight of the heat sink 120 are supported by the third and fourth surfaces, the components being in the y-axis direction. In this manner, the convex portion 430 formed in the heat sink 120 is inserted into the support hole portion 452, and hence the load due to the weight of the heat sink 120 may be supported.

The size and shape of the convex portion 430 formed in the heat sink 120 and the size and shape of the support hole portion 452 are not limited. For example, the support hole portion whose opening shape is a polygonal shape having four or more sides may be formed and four or more surfaces may be formed as the inner peripheral surface. Then, those surfaces may function as the first and second contact surfaces. Components of a load in one direction may be supported by the inner peripheral surface of the support hole portion. Alternatively, a through-hole may be formed as the support hole portion and the convex portion may be inserted into the through-hole.

A support section 460 shown in B of FIG. 10 includes a support convex portion 461 having a rectangular parallelepiped shape, for example. The support convex portion 461 includes first and second surfaces 461a and 461b opposed to each other in the x-axis direction and third and fourth surfaces (not shown) opposed to each other in the y-axis direction.

A hole portion 470 is formed in the heat sink 120 and the support convex portion 461 is inserted into that hole portion 470. The hole portion 470 has a rectangular opening, for example, and an inner peripheral surface 471 formed of four surfaces. In this example, the first and second surfaces 461a and 461b of the support convex portion 461 function as the first and second contact surfaces. Further, the third and fourth surfaces of the support convex portion 461 also function as the first and second contact surfaces.

By inserting the support convex portion 461 into the hole portion 470 formed in the heat sink 120 in this manner, the load due to the weight of the heat sink 120 may be supported. The size and shape of the hole portion 470 and the support convex portion 461 are not limited and may be appropriately designed.

Figure 15:
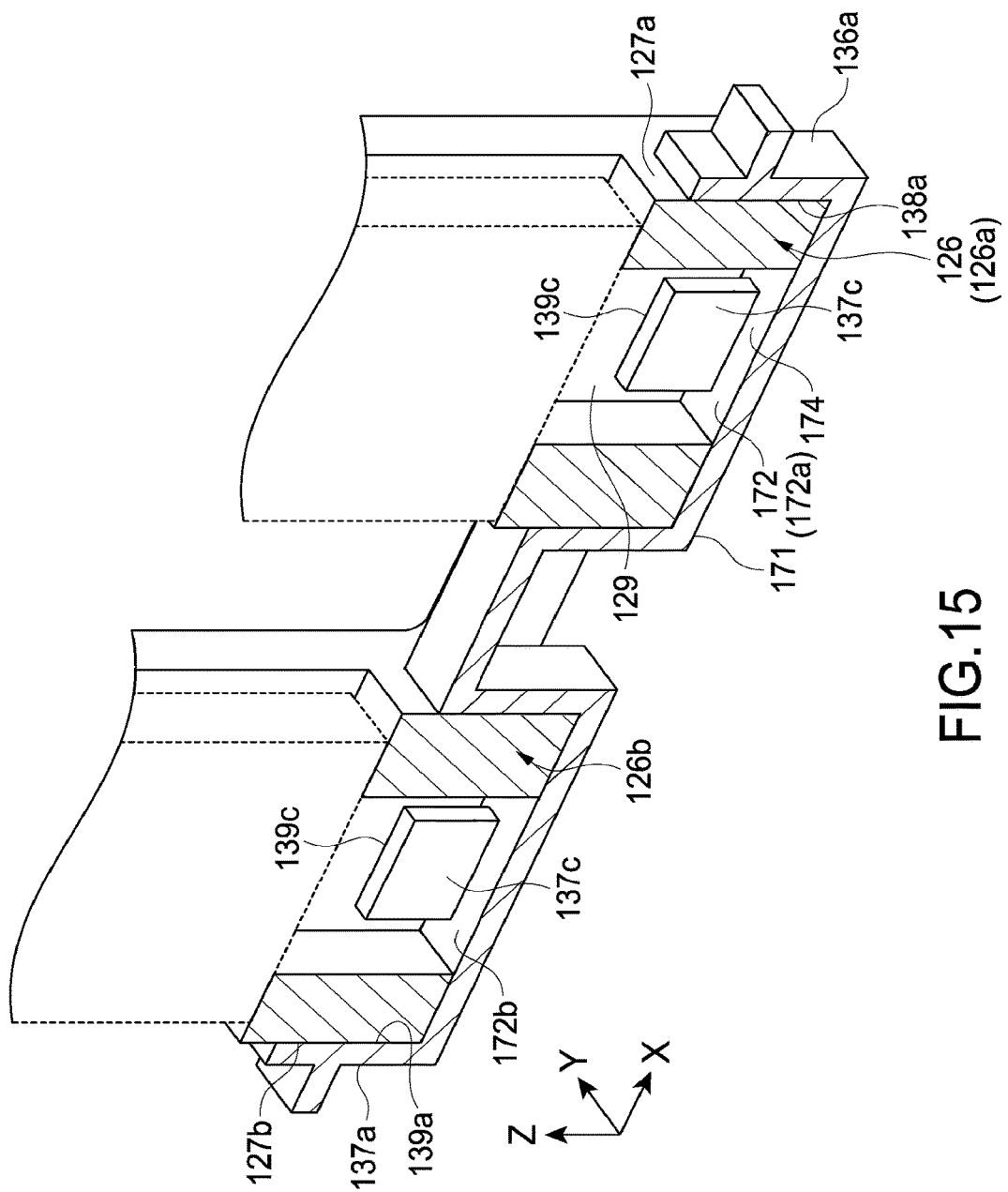
FIG. 15 A schematic enlarged view showing a base bottoms of the heat sink shown in FIG. 6.

Referring to FIGS. 11 to 15, a specific configuration of the support section 130 shown in FIG. 2 will be described. FIGS. 11 to 14 are perspective views of the light source apparatus 100 shown in FIG. 2 as viewed from a bottom surface side, an obliquely front side, a side surface side, and a back side, respectively. FIG. 15 is a schematic cross-sectional view with base bottoms 126 corresponding to lower portions of the bases 122 of the heat sink 120 shown in FIG. 6 being cut.

The support section 130 includes a support base portion 171 coupled to the base portion 1 that supports the light source section 110. As shown in FIG. 15, the support base portion 171 includes two recess portions 172*a* and 172*b* of the light source apparatus 100, which are arranged in the left- and right-hand directions. The heat sink 120 is attached to the light source section 110 such that base bottoms 126*a* and 126*b* of the two bases 122 are respectively received in the two recess portions 172*a* and 172*b*.

Figure 11:
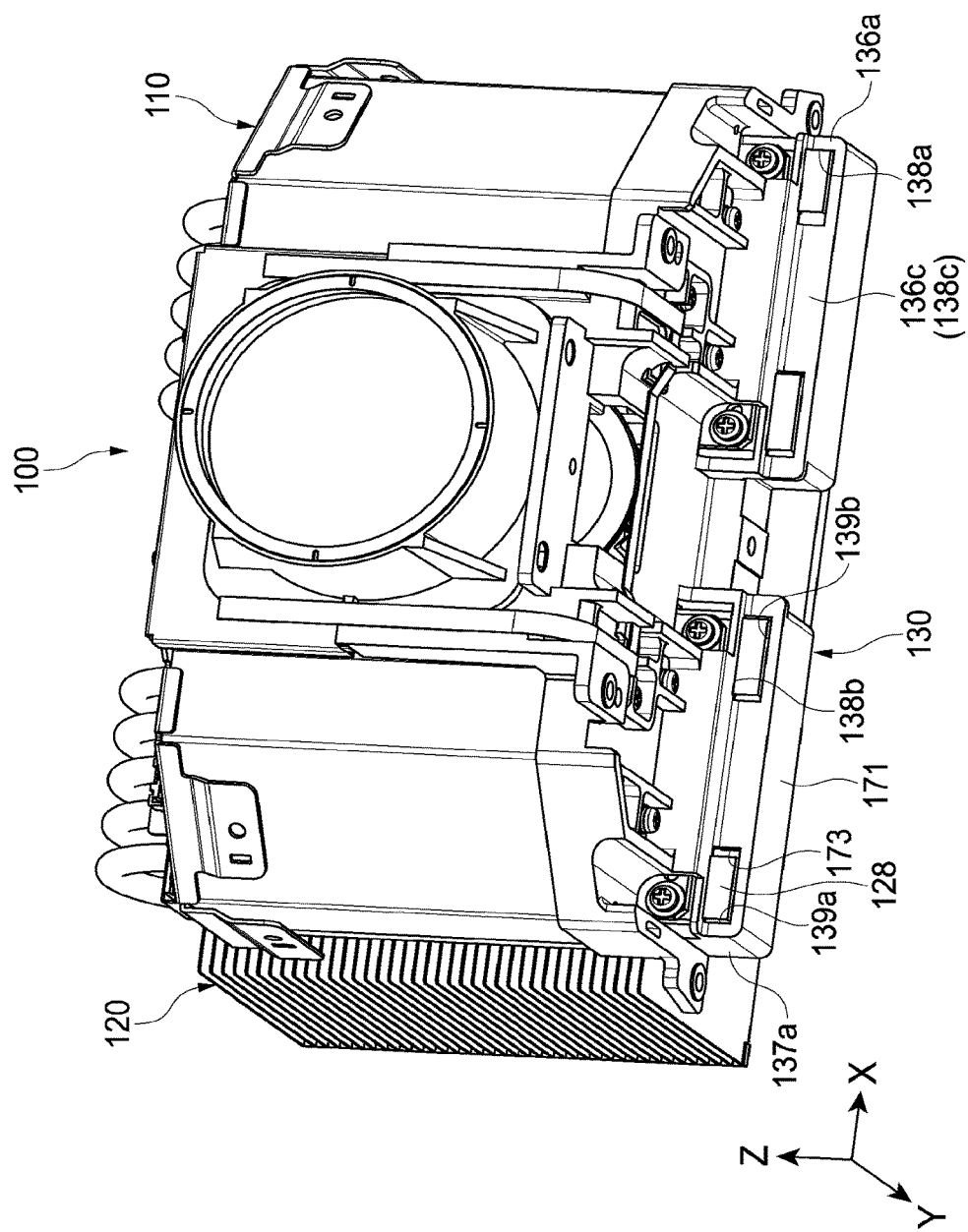
FIG. 11 A perspective view of the light source apparatus shown in FIG. 2 as viewed from a bottom surface side.

As shown in FIGS. 11 and 15 and the like, the first and second contact portions 136*a* and 137*b* are formed in positions of the two base bottoms 126*a* and 126*b*, which are respectively opposed to outer surfaces 127*a* and 127*b*. Surfaces of the first and second contact portions 136*a* and 137*b*, which are opposed to the base bottoms 126*a* and 126*b*, serve as the first and second contact surfaces 138*a* and 139*a*.

Components of a load that acts on the contacted surfaces 70 due to the weight of the heat sink 120 are supported by the first and second contact surfaces 138*a* and 139*a*, the components being in the x-axis direction. Note that which contact surface is set as the first contact surface or the second contact surface is not limited.

Figure 12:
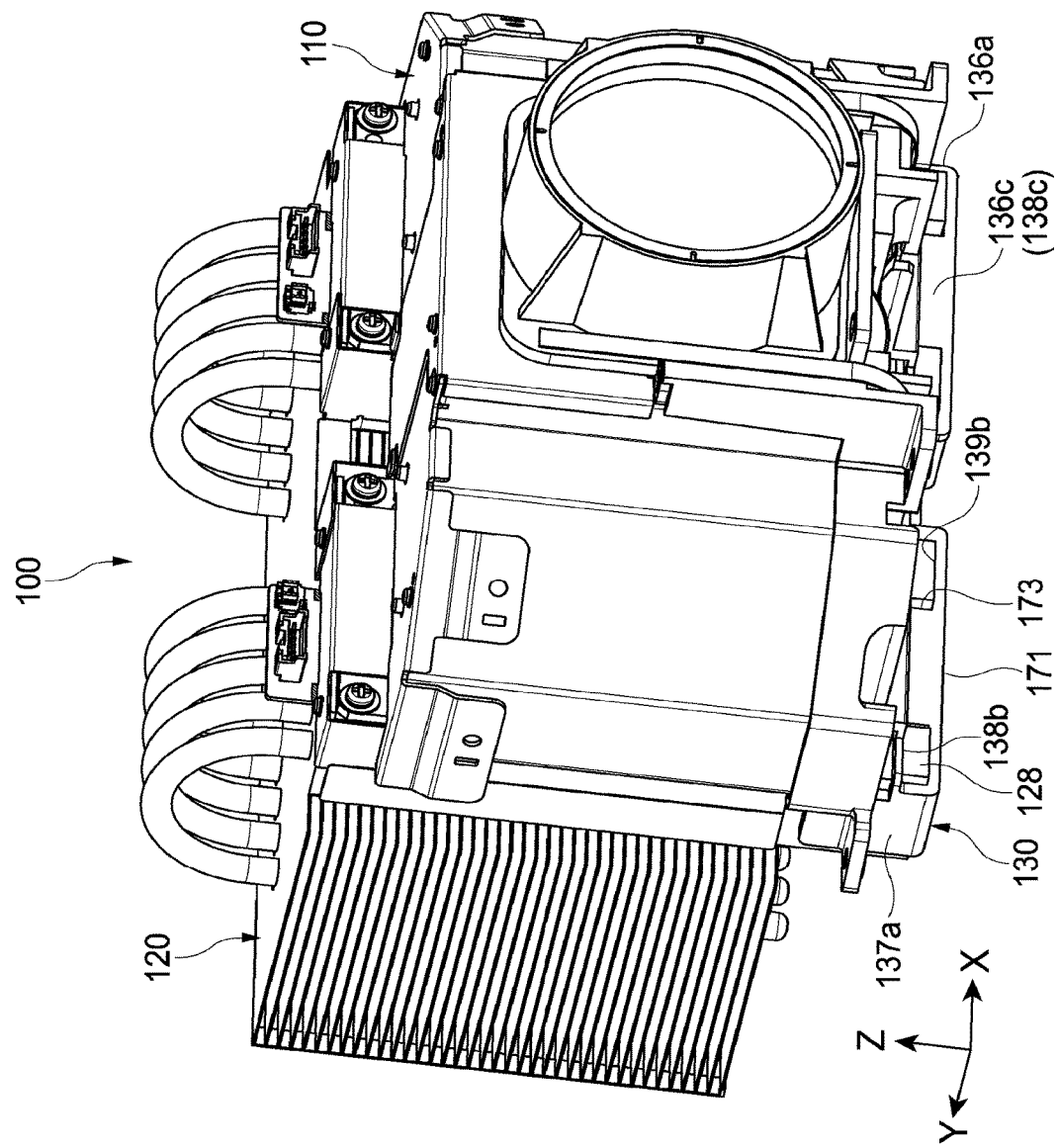
FIG. 12 A perspective view of the light source apparatus shown in FIG. 2 as viewed from an obliquely front side.
Figure 13:
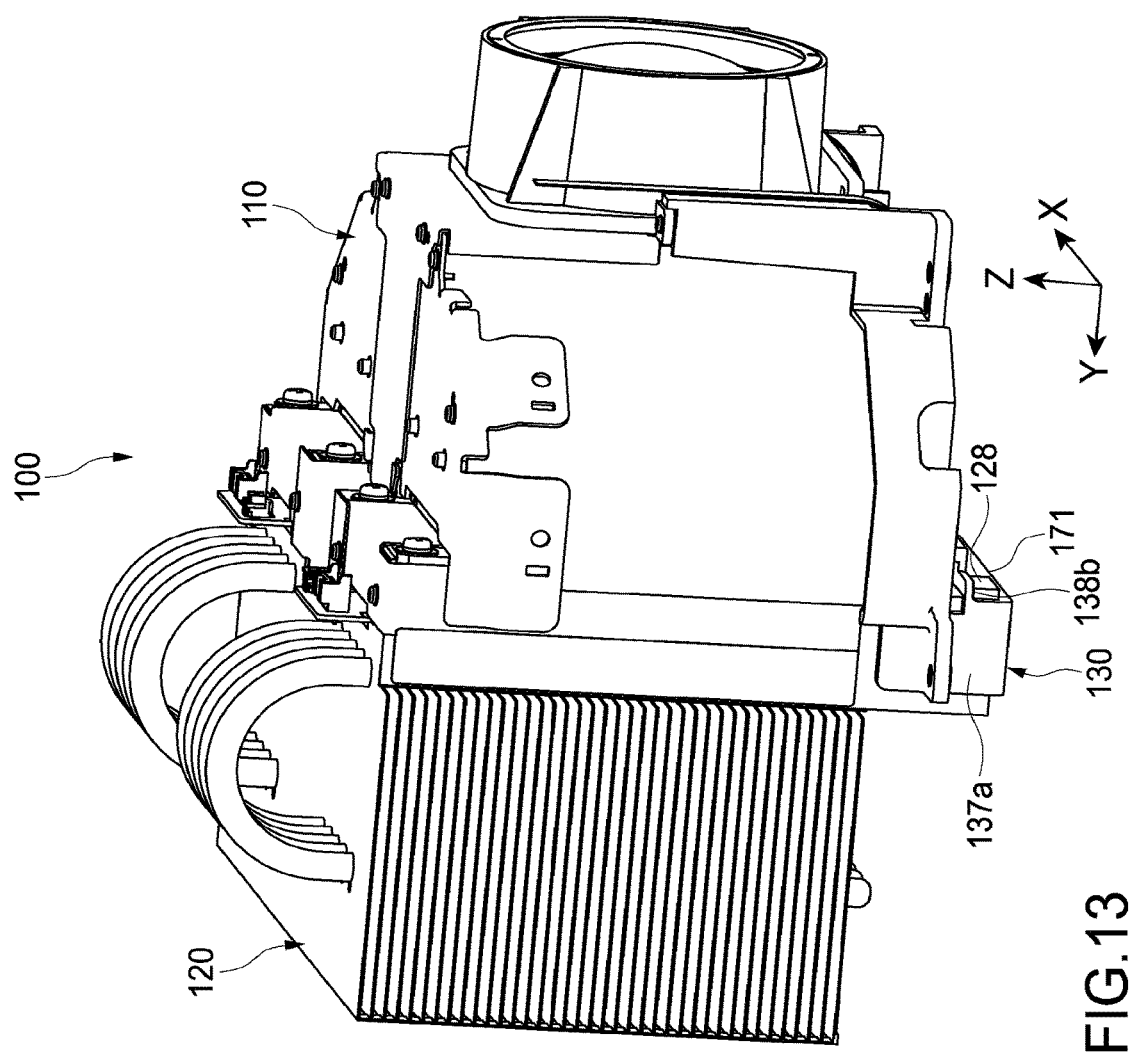
FIG. 13 A perspective view of the light source apparatus shown in FIG. 2 as viewed from a side surface side.
Figure 14:
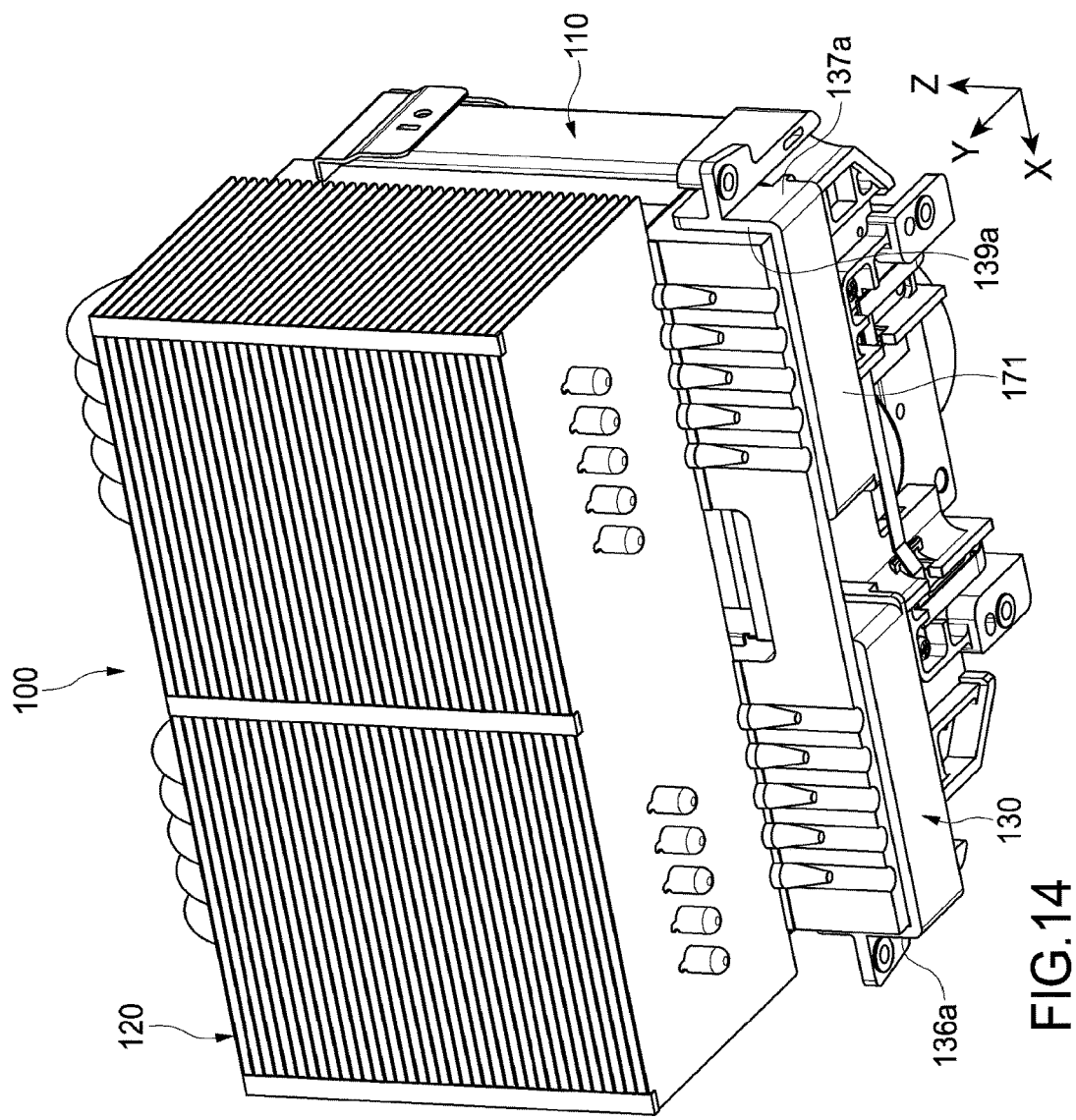
FIG. 14 A perspective view of the light source apparatus shown in FIG. 2 as viewed from a back side.

As shown in FIGS. 11 and 12 and the like, four support hole portions 173 opened in the y-axis direction are formed in the support base portion 171. Two surfaces of each of the support hole portions 173, which are opposed to each other in the z-axis direction, serve as first and second contact surfaces 138*b* and 139*b*. As shown in FIG. 6, four convex portions 128 are formed in the base bottoms 126. The four convex portions 128 are inserted into four support hole portions 173 with the y direction being an insertion direction. With this, components of a load that acts on the contacted surfaces 70 due to the weight of the heat sink 120 are supported by the first and second contact surfaces 138*b* and 139*b*, the components being in the z-axis direction.

As shown in FIGS. 11 and 12 and the like, first contact portions 136*c* are formed on the front side of the base bottoms 126. Surfaces of the first contact portions 136*c*, which are opposed to the base bottoms 126, serve as first contact surfaces 138*c*. Further, as shown in FIG. 15, in bottom portions 174 of the two recess portions 172*a* and 172*b* of the support base portion 171, second contact portions 137*c* each having a plate shape extending in the z-axis direction are formed. Each of the two second contact portions 137*c* is formed in a position in which it is received in each of the recess portions 129 of the base bottoms 126. Surfaces of the second contact portions 137*c*, which are opposed to the recess portions 129, serve as second contact surfaces 139*c*.

The first contact surfaces 138*c* of the first contact portions 136*c* are brought into contact with the front side of the base bottoms 126. Further, the second contact surfaces 139*c* of the second contact portions 137*c* are brought into contact with the recess portions 129 of the base bottoms 126. Thus, components of a load that acts on the contacted surfaces 70 due to the weight of the heat sink 120 are supported, the components being in the y-axis direction.

As described above, in the light source apparatus 100 and the image display apparatus 500 according to this embodiment, components of a load that acts on the contacted surfaces 70 due to the weight of the heat sink 120, which are in at least one direction, are supported in both orientations of that direction. Therefore, influences on the light source section 110 via the contacted surfaces 70 due to the weight of the heat sink 120 can be reduced. Thus, the light source section 110 can be suitably cooled.

It is conceivable that, along with the higher luminance of the image display apparatus, a heavy, large heat sink or the like becomes necessary for sufficiently cooling a solid-state light source such as an LD. If the heavy heat sink or the like is attached, there is a high possibility that influences due to the weight thereof may cause distortion (force, stress, moment, etc.) with respect to the light source section having predetermined emission properties and it may be difficult to ensure the properties.

In view of such a problem, the support section according to the present technology can be used for realizing an attachment mechanism by which influences on the light source section are sufficiently reduced and a reception mechanism capable of suitably receiving the weight of the heat sink in the respective directions. Thus, the LD and the like can be sufficiently cooled while maintaining the emission properties of the light source section.

Further, in the example shown in FIG. 11 and the like, the support section 130 is formed integrally with the rear side of the base portion 1 that supports the light source section 110 and the heat sink 120 is fitted in the support section 130. Thus, it becomes possible to reduce stress and the like that act on the contacted surfaces 70. In this manner, the support section is formed on the basis of the light sources, and hence it is possible to stably ensure a positional relationship for attachment with the light source section that requires optical properties, attachment accuracy, and the like.

Note that, when the light source apparatus 100 shown in FIG. 11 and the like is incorporated in the image display apparatus 500, the attachment is performed via the support section 130 connected to and formed in the base portion 1 or a position near the support section 130 of the base portion 1. With this, attachment strength for the base portion 1 can be enhanced. As a matter of course, it is not limited thereto.

Other Embodiments

The present technology is not limited to the above-mentioned embodiments and various other embodiments can be realized.

Figure 16:
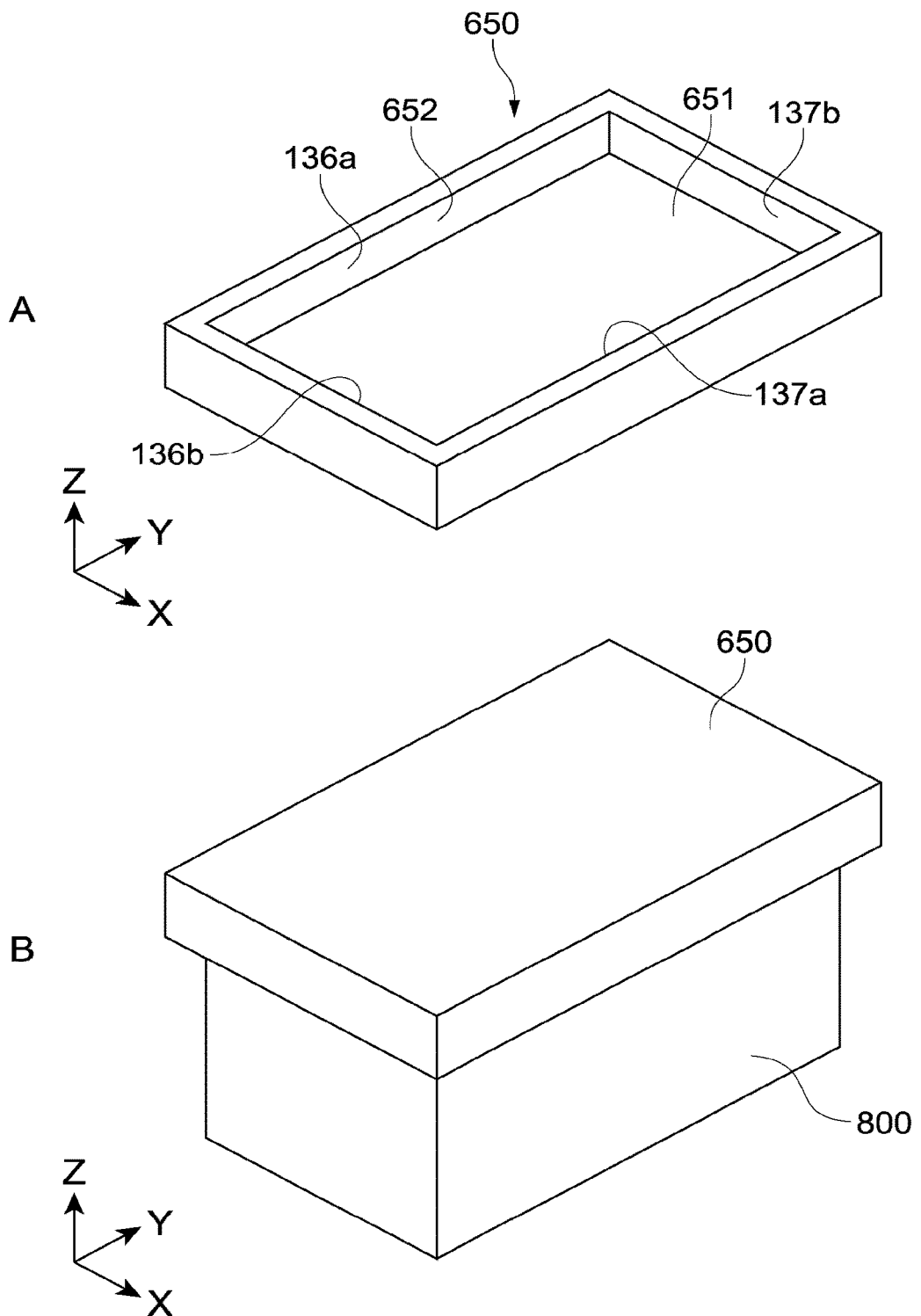
FIG. 16 A schematic diagram showing another configuration example of the support sections according to the present technology.

For example, FIG. 16 is a schematic diagram showing another configuration example of the support section according to the present technology. A support section 650 shown in A of FIG. 16 includes a support recess portion 651 capable of covering one surface of a member 800 attached to the light source section. It can be said that the support recess portion 651 is another embodiment of the support hole portion described with reference to A of FIG. 10.

For example, an upper surface of the member 800 is entirely received in the support recess portion 651. In this case, two surfaces of four surfaces 652 opposed to the member 800, which are opposed to each other in a predetermined direction, function as the first and second contact surfaces. In the example shown in FIG. 16, a load in the x-axis direction is supported by first and second contact surfaces 136*a* and 137*a* opposed to each other in the x-axis direction, in both orientations. Further, a load in the y-axis direction is supported by first and second contact surfaces 136*b* and 137*b* opposed to each other in the y-axis direction, in both orientations. As in the above, how to form and arrange the first and second contact surfaces is not limited. Various configurations may be appropriately employed.

The predetermined direction can be any direction. It is not limited to the first direction that is the perpendicular direction of the contacted surface, the second direction orthogonal thereto, or the third direction orthogonal to both of the first and second directions.

In the above, the heat sink has been exemplified as the member attached to the light source section. However, also when a cooling member other than the heat sink is attached, the present technology is applicable. In addition, it is not limited to the cooling member. The present technology is applicable also when other members such as a power supply unit and a control unit are attached, for example.

In the image display apparatus 500 shown in FIG. 1, a transmissive liquid-crystal panel has been used as the image generation element. This may be replaced by a reflective liquid-crystal panel, a digital micromirror device (DMD), or the like. In addition, the configuration of the image display apparatus may be appropriately set.

The light source apparatus according to the present technology may be used in an apparatus different from the image display apparatus, such as an illumination apparatus and a sensor apparatus.

Note that the effects described in the present disclosure are merely examples and not limitative. Further, other effects may be provided. The above description of the plurality of effects does not imply that those effects are necessarily exerted at the same time. It implies that at least any of the above-mentioned effects can be obtained in a manner that depends on the conditions, for example. As a matter of course, effects not described in the present disclosure may be exerted.

At least two feature parts of the feature parts of the above-mentioned embodiments can also be combined. That is, the various feature parts described in the embodiments may be arbitrarily combined without distinction of the embodiments.

Note that the present technology may also take the following configurations.

(1) A light source apparatus, including:
a light source section including a contacted surface formed in a predetermined position;
a member that is attached to the light source section and in contact with the contacted surface; and
a support section capable of supporting a component of a load that acts on the contacted surface due to the weight of the member, the component being in at least a predetermined direction and supported by the support section in both orientations of the predetermined direction.

(2) The light source apparatus according to (1), in which
the light source section includes one or more light sources, and
the member is a cooling member that cools the one or more light sources via the contacted surface.

(3) The light source apparatus according to (1) or (2), in which
the support section is capable of supporting components of the load, the components being in a first direction that is a direction of a normal of the contacted surface, a second direction orthogonal to the first direction, and a third direction orthogonal to both of the first and second directions.

(4) The light source apparatus according to any one of (1) to (3), in which
the support section includes
a first contact surface capable of being brought into contact with the member while the first contact surface being oriented in a first orientation of the predetermined first direction, and
a second contact surface capable of being brought into contact with the member while the second contact surface being oriented in a second orientation opposite to the first orientation of the predetermined direction.

(5) The light source apparatus according to (4), in which
the first and second contact surfaces are arranged in positions such that a clearance is formed with respect to the member, in a reference attachment position in which the member is attached to the light source section.

(6) The light source apparatus according to (4) or (5), in which
the support section includes
a first contact portion including the first contact surface, and
a second contact portion that includes the second contact surface and is positioned opposed to the first contact portion while sandwiching the member therebetween.

(7) The light source apparatus according to any one of (4) to (6), in which
the member includes a convex portion, and
the support section includes a support hole portion that includes an inner peripheral surface that is the first and second contact surfaces, the convex portion being inserted into the support hole portion.

(8) The light source apparatus according to any one of (4) to (7), in which
the member includes a hole portion, and
the support section includes a support convex portion that includes the first and second contact surfaces and is inserted into the hole portion.

DESCRIPTION OF SYMBOLS

C clearance
31 laser light source
70 contacted surface
100 light source apparatus
110, 110' light source section
120 heat sink (cooling member)
128, 430 convex portion
130, 150, 450, 460, 650 support section
131 first support member
132 second support member
133 third support member
136 first contact portion
137 second contact portion
138 first contact surface
139 second contact surface
173, 452 support hole portion
470 hole portion
461 support convex portion
500 image display apparatus
651 support recess portion

The invention claimed is:

1. A light source apparatus, comprising:
a light source section including a contacted surface formed at a predetermined position;
a member that is attached to the light source section and in contact with the contacted surface; and
a support section configured to support the member so as to reduce a force applied to the contact surface in a predetermined direction and to reduce another force applied in a direction opposite the predetermined direction, wherein
the support section includes
a first contact surface configured to be in contact with the member and be in a first direction against the predetermined direction, and
a second contact surface configured to be in contact with the member and be in a second direction against the first direction that is opposite of the predetermined direction.

2. The light source apparatus according to claim 1, wherein
the light source section includes one or more light sources, and
the member is a cooling member that cools the one or more light sources via the contacted surface.

3. The light source apparatus according to claim 1, wherein the support section is configured to support the member so as to reduce a first force in the first direction of a normal of the contacted surface, a second force in a third direction orthogonal to the first direction, and a third force in a fourth direction orthogonal to both of the first and third directions.

4. The light source apparatus according to claim 1, wherein the first and second contact surfaces are arranged in positions such that the first and second contact surfaces form a clearance together with the member, in a reference attachment position in which the member is attached to the light source section.

5. The light source apparatus according to claim 1, wherein the support section includes
a first contact portion including the first contact surface, and
a second contact portion that includes the second contact surface and is positioned opposed to the first contact portion while sandwiching the member therebetween.

6. The light source apparatus according to claim 1, wherein
the member includes a convex portion, and
the support section includes a support hole portion that includes an inner peripheral surface that is the first and second contact surfaces, the convex portion being inserted into the support hole portion.

7. The light source apparatus according to claim 1, wherein
the member includes a hole portion, and
the support section includes a support convex portion that includes the first and second contact surfaces and is inserted into the hole portion.

8. An image display apparatus, comprising:
a light source apparatus that includes:
a light source section including a contacted surface formed at a predetermined position,
a member that is attached to the light source section and in contact with the contacted surface, and
a support section configured to support the member so as to reduce a force applied to the contact surface in a predetermined direction and to reduce another force applied in a direction opposite the predetermined direction, the support section including
a first contact surface configured to be in contact with the member and be in a first direction against the predetermined direction, and
a second contact surface configured to be in contact with the member and be in a second direction against the first direction that is opposite of the predetermined direction;
an image generation system that includes:
an image generation element that generates an image on the basis of irradiated light, and
an illumination optical system that irradiates the image generation element with light from the light source apparatus; and
a projection system that projects the image generated by the image generation element.

9. The image display apparatus according to claim 8, wherein
the light source section includes one or more light sources, and
the member is a cooling member that cools the one or more light sources via the contacted surface.

10. The image display apparatus according to claim 8, wherein the support section is configured to support the member so as to reduce a first force in the first direction of a normal of the contacted surface, a second force in a third direction orthogonal to the first direction, and a third force in a fourth direction orthogonal to both of the first and third directions.

11. The image display apparatus according to claim 8, wherein the first and second contact surfaces are arranged in positions such that the first and second contact surfaces form a clearance together with the member, in a reference attachment position in which the member is attached to the light source section.

12. The image display apparatus according to claim 8, wherein the support section includes
a first contact portion including the first contact surface, and
a second contact portion that includes the second contact surface and is positioned opposed to the first contact portion while sandwiching the member therebetween.

13. The image display apparatus according to claim 8, wherein
the member includes a convex portion, and
the support section includes a support hole portion that includes an inner peripheral surface that is the first and second contact surfaces, the convex portion being inserted into the support hole portion.

14. The image display apparatus according to claim 8, wherein
the member includes a hole portion, and
the support section includes a support convex portion that includes the first and second contact surfaces and is inserted into the hole portion.

* * * * *